United States Patent
Baumann

(10) Patent No.: US 9,500,726 B2
(45) Date of Patent: Nov. 22, 2016

(54) NMR PROBE HEAD WITH VARIABLE RF RESONANT CIRCUIT CAPACITOR WHICH CAN BE ADJUSTED IN STEPS VIA A PIEZO-ELECTRIC ACTUATOR

(71) Applicant: BRUKER BIOSPIN AG, Faellanden (CH)

(72) Inventor: Daniel Guy Baumann, Faellanden (CH)

(73) Assignee: Bruker BioSpin AG, Faellenden (CH)

( * ) Notice: Subject to any disclaimer, the term of this patent is extended or adjusted under 35 U.S.C. 154(b) by 485 days.

(21) Appl. No.: 14/195,919

(22) Filed: Mar. 4, 2014

(65) Prior Publication Data
US 2014/0253124 A1    Sep. 11, 2014

(30) Foreign Application Priority Data

Mar. 11, 2013   (DE) .................. 10 2013 204 131

(51) Int. Cl.
*G01V 3/00* (2006.01)
*G01R 33/34* (2006.01)
*G01R 33/30* (2006.01)
*G01R 33/36* (2006.01)

(52) U.S. Cl.
CPC ............... *G01R 33/34* (2013.01); *G01R 33/30* (2013.01); *G01R 33/34092* (2013.01); *G01R 33/36* (2013.01); *G01R 33/3628* (2013.01)

(58) Field of Classification Search
USPC ....................................................... 324/322
See application file for complete search history.

(56) References Cited

U.S. PATENT DOCUMENTS

| | | | |
|---|---|---|---|
| 3,213,340 A | 10/1965 | Robertson | |
| 3,447,047 A | 5/1969 | Lindsay | |
| 3,639,816 A * | 2/1972 | Lindsay | H01G 4/02 361/279 |
| 3,662,235 A * | 5/1972 | Napolin | H01G 4/02 29/25.42 |
| 4,894,579 A | 1/1990 | Higuchi | |
| 5,568,004 A | 10/1996 | Kleindiek | |
| 6,204,665 B1 | 3/2001 | Triebe | |
| 7,061,745 B2 | 6/2006 | Funk | |
| 7,064,549 B1 * | 6/2006 | Hudson | G01R 33/3628 324/318 |
| 2006/0067027 A1 * | 3/2006 | Funk | G01R 33/3628 361/277 |
| 2008/0117560 A1 | 5/2008 | Finnigan | |
| 2013/0229747 A1 * | 9/2013 | Finnigan | H01G 5/38 361/299.1 |

OTHER PUBLICATIONS

"Agilent Pro Tune Probe Tuning Accessory", Agilent Technologies, 2012.
"JNM-ECS series", JEOL Ltd, 2007.
"ATM-Accessory", Bruker BioSpin AG, 2009.
"Agilent 400-MR DD2 System", Agilent Technologies, 2011.

* cited by examiner

Primary Examiner — Rodney Fuller
(74) Attorney, Agent, or Firm — Paul Vincent

(57) ABSTRACT

An NMR probe head has a capacitor with a dielectric (5), which surrounds a cavity (15) in which a capacitor piston (7) is disposed. A sliding bush (9) has a through hole (16) in which a piston operating rod (8) extends. The piston operating rod (8) is connected to a piezo-electric actuator and to the capacitor piston (7) in such a way that it displaces the capacitor piston linearly when a sawtooth voltage is applied to the piezo-electric actuator. The sliding bush thereby applies braking friction to the piston operating rod during linear displacement of the capacitor piston and only allows the piston operating rod to slide through during the steep edges of the sawtooth voltage. This avoids the disadvantages of prior art, wherein the NMR probe head remains compact and the material cost and manufacturing complexity are reduced.

13 Claims, 2 Drawing Sheets

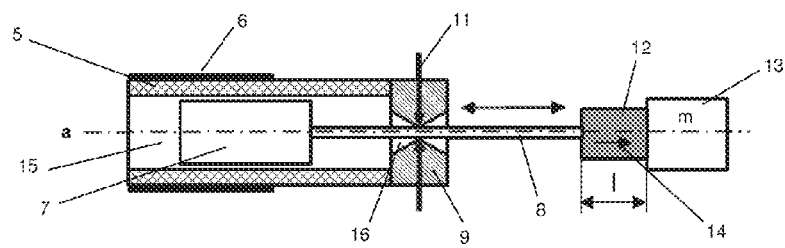
Fig. 1
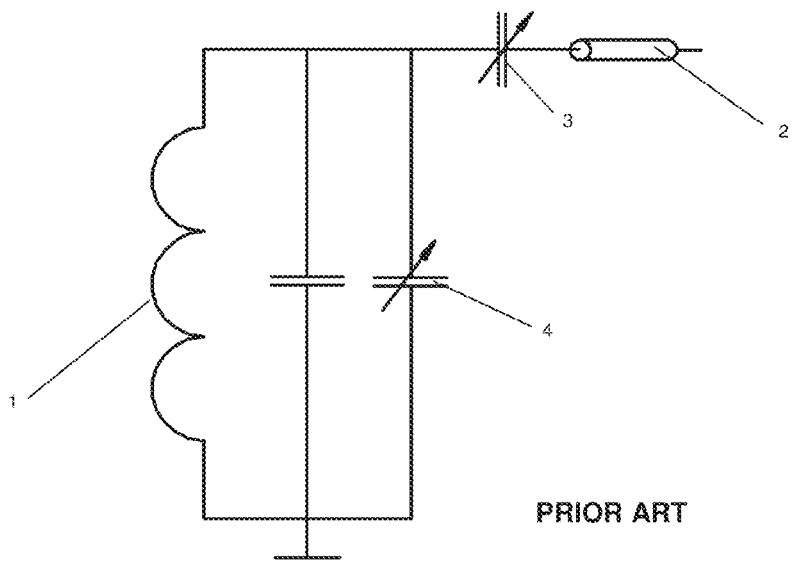
PRIOR ART
Fig. 2
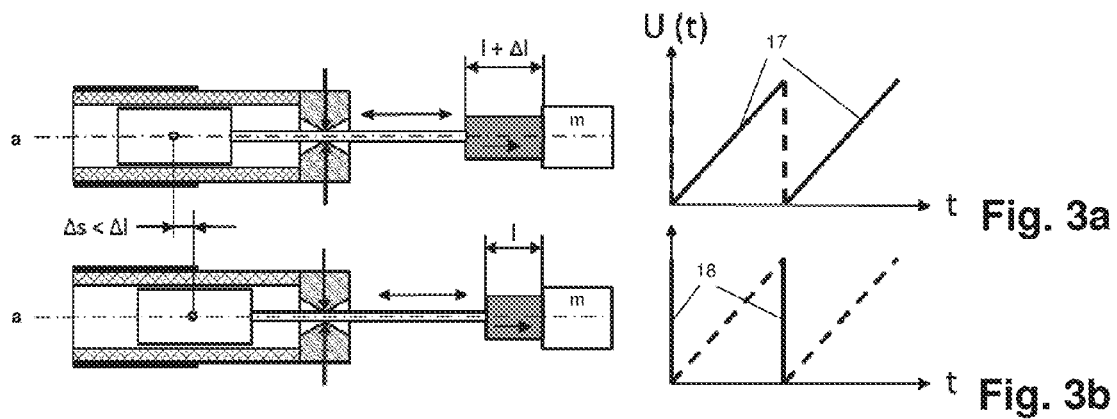
Fig. 3a
Fig. 3b

NMR PROBE HEAD WITH VARIABLE RF RESONANT CIRCUIT CAPACITOR WHICH CAN BE ADJUSTED IN STEPS VIA A PIEZO-ELECTRIC ACTUATOR

This application claims Paris convention priority from DE 10 2013 204 131.4 filed Mar. 11, 2013, the entire disclosure of which is hereby incorporated by reference.

BACKGROUND OF THE INVENTION

The invention relates to an NMR(=nuclear magnetic resonance) probe head with at least one capacitor that is motorized and tunable by means of a piezo-electric actuator in the RF(=radio frequency) resonant circuit of the NMR probe head, wherein the capacitor has a dielectric, which at least partially surrounds a cavity and which is connected to at least one electrode, at which a first and possibly a further electrical potential of the capacitor can be picked off, and wherein a capacitor piston with an electrically conductive surface is disposed in the cavity inside the dielectric and is displaced linearly by the action of the piezo-electric actuator by application of a sawtooth-waveform electric voltage to the piezo-electric actuator, the piezo-electric actuator being disposed outside the cavity as an extension of the axis of the capacitor piston.

Such an assembly is known from US 2008/0 117 560 A1(=Reference [10]).

NMR methods are used to analyze the composition of samples or to determine the structure of materials in samples. NMR spectroscopy is a powerful process of instrumental analysis. In this NMR process, the sample is exposed to a strong static magnetic field $B_0$ in the z direction, to which orthogonal radio-frequency electromagnetic pulses are irradiated into the sample in the x or y direction. As a result, interaction with the nuclear spin of the sample material occurs. The development over time of these nuclear spins in the sample, in turn, generates radio-frequency electromagnetic fields, which are detected in the NMR apparatus. Information about the characteristics of the sample can be obtained from the detected RF fields. In particular, the position and intensity of the NMR lines provide information about the chemical bonds in the sample.

RF radiation is transmitted and received with so-called RF resonators. The RF resonators are disposed in close proximity to the sample, or the sample is disposed inside the RF resonators.

The electrical network of an NMR probe head usually consists of at least one electrical RF resonant circuit. There is one RF resonant circuit in the NMR probe head (see FIG. 2) for each atomic nucleus (e.g. 1H, 13C or 15N) that an NMR probe head can excite and detect for an NMR measurement of high quality, these RF resonant circuits must be finely tuned to each of the atomic nuclei to be measured in this way. As a rule, this is achieved with two continuously variable capacitors (tuning and matching) per RF resonant circuit. These are preferably rotary and/or sliding capacitors.

Besides continuously variable capacitors, there are also capacitors that can be adjusted in steps (switchable capacitors) with which the RF resonant circuits can be switched from one nuclear magnetic resonance to another. It is important that the electronic components (NMR coils, fixed and variable capacitors) of the RF resonant circuits be as close to each other as possible and that the electric wires extend over as short a distance as possible. Of course, they must be far enough apart to still guarantee the dielectric strength of the RF resonant circuits. This ensures that the electrical losses are kept to a minimum and the Q-value of the RF resonant circuits is as high as possible. Because in an NMR measurement the sample under examination is always moved into the magnetic center of the NMR magnet, not only the NMR coils but also the RF resonant circuits as a whole, including the variable capacitors, must be positioned as close as possible to the sample under examination in the NMR probe head. The problem lies in the accessibility of the variable capacitors, which usually come to lie several decimeters inside a magnet bore of a few centimeters in diameter and which must be tuned frequently (e.g. after each time the sample is changed and before the actual NMR measurement).

For the user of the NMR apparatus to be able to tune the relevant nuclear magnetic resonances of the RF resonant circuits via the variable capacitors, it must be easy to adjust the capacitors when they are installed in the NMR probe head. This can be achieved, for example, using adjustment rods, one end of which is attached to the variable electronic components and the other end of which is brought out to a location easily accessible by the user outside the NMR magnet. The adjustment rods are pushed and/or rotated depending on the type of variable capacitor. In addition to the adjustment rods, motors, cardan joints, flexible shafts [1, 2], gears and/or screw gears are frequently used. Motors with the relevant sensor technology permit automatic adjustment of the RF resonant circuits [3, 4].

These solutions have the following disadvantages:
1. Complex and fault-prone mechanisms (e.g. cardan joint and gears).
2. Hysteresis (compliance and play) in the mechanism. This impedes automatic adjustment, in particular.
3. Drift and slip-stick movements caused by thermal expansion. This results in unwanted detuning of the RF resonant circuits during the NMR experiment.
4. Because it has to be ensured that every single adjustment path is statically defined and free of stress, design and assembly thereof is correspondingly complex and demanding.
5. Electric motors [3] cannot be directly coupled to variable capacitors or located in the vicinity of the bore of the nuclear magnetic resonance magnet because the stray magnetic field of the nuclear magnetic resonance magnet is so high that the electric motors would be damaged (e.g. demagnetization of the permanent magnets) and the torque of the motor heavily reduced or even eliminated.
6. Moreover, for a cryo NMR probe head, a complex vacuum feed-through must be implemented for each adjustment path. Because of the stray magnetic field of the NMR magnet, lack of space, degassing problems and insufficient dissipation of heat in the vacuum, it is very difficult to locate conventional electric motors inside, or in the vacuum of, a cryogenic NMR probe head.

In the vicinity of the variable capacitors (cylindrical volume with a diameter of approximately 40 mm), the (cryo) NMR probe head offers very little space for accommodating up to twelve electric motors (diameter approximately 10 mm). The electric motors are therefore mounted in the vicinity of the NMR probe head outside the NMR magnet or magnet bore and must be coupled to the variable capacitors, for example, by means of a coupling element (shafts, rods, gears, cardan joints).

The object of this invention is therefore to modify an NMR probe head of the type defined in the introduction using as simple technical measures as possible, so that the disadvantages listed above are largely eliminated without reducing the quality of the NMR measurements, wherein the NMR probe head is to be kept as compact as possible and the material costs and manufacturing complexity reduced.

SUMMARY OF THE INVENTION

This object is achieved in a manner that is surprisingly simple and effective on a generic NMR probe head with the characteristics defined in the introduction with a sliding bush that is mechanically connected to the dielectric and having a through-hole through which a piston operating rod extends, which can operate the capacitor piston, which can be moved in the cavity, and which is mechanically connected to the piezo-electric actuator in such a way that when the sawtooth-waveform electrical voltage is applied to the piezo-electric actuator, the piston operating rod moves the capacitor piston linearly, wherein the characteristics of the sliding bush are such that it applies braking friction to the piston operating rod during linear displacement of the capacitor piston and only allows the piston operating rod to slide through during the steep edges of the applied sawtooth voltage.

Unlike motorized variable capacitors according to prior art [7, 8, 9, 10], one of the advantages of this invention is that using an already known and often successfully used structure of a variable capacitor together with just one piezo-electric actuator, and if necessary, a mass element and a suitable sliding bush, an extremely compact motorized variable capacitor can be implemented in a simple way, which can be installed in large numbers in an NMR probe head in the vicinity of the magnetic center of an NMR magnet. Moreover, this NMR probe head can be implemented in a vacuum and/or under cryogenic temperatures. All of the disadvantages and difficulties of the prior art stated above can be eliminated with this inventively modified motorized variable capacitor.

An embodiment of the inventive NMR probe head is especially preferred in which a mass element of mass m is attached to the side of the piezo-electric actuator facing away from the piston operating rod in such a way that, when a sawtooth-waveform electric voltage is applied to the piezo-electric actuator, the mass element moves with the actuator in the direction of the latter's polarization and additional inertial forces are produced due to its mass m. The additional mass m has the advantage that it makes the motorized variable capacitor more efficient and therefore can be operated at lower voltages to achieve steps Δs of the same size than without mass m. This can be illustrated by the relationship below, which describes the step size Δs of the motorized variable capacitor assuming that the gradient of the steep sawtooth edge is infinite:

Assuming that the masses $m_K$ (mass of the capacitor piston) and $m_{KS}$ (mass of the piston operating rod) are much smaller than the masses $m_A$ (mass of the actuator) and m, with the corresponding mass m and half the sawtooth voltage and/or half the deflection Δl of the actuator, an almost equally sized step Δs is possible as without mass m and a whole sawtooth voltage and/or full deflection Δl:

$$\Delta s = ((m + 1/2\ m_A)/(m + m_K + m_{KS} + m_A))\Delta l$$

An embodiment is also preferred in which at least the outer surfaces of the capacitor piston and the piston operating rod are constructed from electrically conductive material and on which an electrical connection of the capacitor is mounted, at which a second electrical potential of the capacitor can be picked off. This has the advantage that the second electrical potential of a variable capacitor according to FIG. 1 does not have to be picked off in an awkward manner directly from the capacitor piston, which is, of course, always positioned inside the dielectric, but can be picked off on a region of the piston operating rod that is always outside the dielectric when the capacitor piston is fully extended or retracted. The length of the piston operating rod outside the dielectric and in the fully extended state must therefore be longer than the required travel path of the capacitor piston.

In a further embodiment, at least the surfaces of the sliding bush facing toward the outside are also constructed from electrically conductive material and form an electrical contact with the piston operating rod so that the second electrical potential of the capacitor can be picked off at the sliding bush. This embodiment with an additional electrically conducting sliding bush has the additional advantage over the embodiment, in which only the capacitor pistons and the piston operating rod are electrically conductive, that with an as short as possible conductor—the travel path of the capacitor piston and/or the piston operating rod does not have to be taken into account—the second electrical potential can be picked off at an unmoved or static part of the variable capacitor. To keep the electrical losses as low as possible and the quality of the RF resonant circuit correspondingly high, the RF resonant circuits should be implemented with the shortest possible electrical conductors. Moreover, because the electrical conductor does not move with the capacitor piston or the piston operating rod, but always remains in one position, the electrical conductor is not subjected to mechanical strain and is not in danger of suffering fatigue failure.

A further preferred embodiment of the inventive NMR probe head is characterized in that the capacitor is mechanically rigidly fixed to the NMR probe head via the sliding bush. The slightest positional changes of electronic components (e.g. capacitors and coils that are fixed, continuously adjustable, or adjustable in steps) and electric conductors of the RF resonant circuit can detune the latter and drastically alter the performance of an NMR probe head. It is therefore important that the electronic components, such as, for example, variable capacitors, be connected as rigidly as possible to the NMR probe head so that they maintain their position as far as possible for every operating condition. Moreover, during an NMR measurement, the NMR probe head and its RF resonant circuits are exposed to a powerful magnetic field from the NMR magnet of usually several Tesla. Because, during an NMR measurement, currents flow through the RF resonant circuits, electronic components, and electrical conductors, Lorentz forces also act upon them. The mechanical fastening interface of the variable capacitor used to fix it to the NMR probe head is the sliding bush. Where possible, use of the dielectric as a fastening interface should be avoided due to its fragility.

Especially advantageous is a class of embodiments of the invention, which is characterized in that a mechanical hollow body contains the piezo-electric actuator in its cavity and mechanically clamps it in its direction of polarization. As a rule, piezo-electric actuators do not have mounting interfaces, such as, for example, threaded holes. With a hollow body according to FIG. 5, which is equipped to hold and clamp the actuator with a mounting interface at each end (e.g. with a threaded hole at each end) and accommodates and clamps the actuator as described above, assembly of a motorized variable capacitor is vastly simplified. The actuator, which is clamped by a hollow body provided with at least one mounting interface or threaded hole, only needs to be screwed to the piston operating rod of a variable capacitor, which has an external thread at its end.

If an additional mass m is required, this can be fixed and/or screwed to the free end of the hollow body. A longitudinal rigidity and yield point of the hollow body in the direction of action or polarization direction of the actuator should be chosen that still allows the actuator sufficient room to expand. Clamping is achieved because in the polarization direction or direction of action of the actuator, the cavity has appropriately smaller dimensions than the length of the piezo-electric actuator. One possible way of putting the actuator into the smaller dimensioned cavity is to cool the actuator, heat the hollow body, and then join them with play. As soon as the hollow body and the actuator return to ambient temperature, the hollow body holds or clamps the actuator.

In preferred further variants of this class of embodiment, the magnitude of the mechanical stress exerted by the mechanical hollow body on the piezo-electric actuator is chosen such that the piezo-electric actuator is always suitably compressed. Because the piezo-electric actuators should preferably only be subjected to minimal tensile stress, as otherwise the likelihood that the actuator will crack increases, thus reducing the service life of the actuator, it is advantageous if a suitable compression is always exerted on the piezo-electric actuators during operation. This can also be achieved with the hollow body. The pre-stressing of the actuator by the hollow body must then be chosen such that the actuator is always suitably compressed both in unipolar and in bipolar operation. The actuator is then always pre-stressed across the entire possible range of action and only subjected to minimal tensile stress. Unlike in unipolar operation (electric field only in the direction of the polarization direction of the actuator) of a piezo-electric actuator, in bipolar operation, a piezo-electric actuator is also subjected to negative stresses (electric field opposite to the polarization direction of the actuator). Negative stress shortens the piezo-electric actuator as compared with its unstressed length.

In further advantageous variants, the mechanical hollow body is constructed integrally with the mass element. Assembly of a motorized variable capacitor with an additional mass m can be further simplified if the hollow body and the additional mass m are integral with each other. The integral hollow body with additional mass and actuator can be simply prefabricated as an assembly, which then merely has to be screwed onto the piston operating rod of a variable capacitor, which has an external thread at its end.

Further preferred embodiments of the invention are characterized in that the moving parts of the capacitor, in particular, the capacitor piston, the piston operating rod, the piezo-electric actuator, and the mass element, can be secured against rotation about the axis of the capacitor piston by the choice of cross-sectional shape, preferably a triangular cross-section at least of the piston operating rod and of the through-hole of the sliding bush. If the cross-section of the through-hole and of the piston operating rod is circular, the moving parts of the capacitor can rotate uncontrollably during operation. This can result in the two electrical supply lines for supplying the piezo-electric actuator with electricity becoming tangled and twisted. This should be avoided as otherwise the electrical supply cables could be damaged. With using a non-circular cross-section (e.g. triangular) of the through-hole and of the piston operating rod, the degree of rotational freedom of the moving parts will be constrained, the latter being thus secured against rotating.

Finally, an embodiment of the inventive NMR probe head is especially preferred, in which the sliding bush has a mechanically rigid part and an elastic part. The sliding bush of the capacitor should be able to perform up to four functions simultaneously. The dielectric should be fastened directly to the sliding bush. Moreover, it should be possible to pick off the second electrical potential of the capacitor on the sliding bush as shown in FIG. 1. Furthermore, the variable capacitor is fastened via the NMR probe head. Besides the maximum three fastening functions of the sliding bush, the sliding bush also acts as a bearing without play and possibly provides the electrically conductive contacting of the moving part and/or of the piston operating rod of the capacitor. The more compliant the bearing or sliding bush is, the more imprecise the diameter of the piston operating rod can be. The more compliant and elastic the sliding bush is, the more unsuitable it is for performing the up to three fastening functions, in particular, fastening the capacitor to the NMR probe head. It is therefore advantageous if the sliding bush has a mechanically rigid and an elastic region.

An advantageous variant of this embodiment is characterized by an elastic part of the sliding bush, which is constituted in the shape of a collet, clamps the piston operating rod and produces mechanical friction and possibly electrically conductive contact between the sliding bush and the piston operating rod. In practical use, the mechanical friction force between the sliding bush and the piston operating rod will influence the step size of the motorized variable capacitor. The more elastic the compliant guide part of the sliding bush is, the less diameter fluctuations of the piston operating rod will influence the clamping force and the mechanical friction force, and thus the step size and possibly the electrical contacting will be reproducible. Therefore, the spring constant of the elastic guide part should be as small as possible so that the slope of the spring characteristic curve is as flat as possible. This can be achieved, for example, by constituting the elastic part of the sliding bush in the shape of a collet.

Alternatively or additionally, in another further embodiment, the mechanically rigid part can be constituted integrally with the elastic collet shaped part of the sliding bush. This has the advantage that such an integral sliding bush is extremely simple to manufacture. To mechanically manufacture such a sliding bush, a cylinder made of a suitable material with a stepped and coaxial bore as shown in FIGS. 6a and 6b is initially required. In the next manufacturing step, from the side of the cylinder with the smaller diameter, the cylinder is provided with a certain number of slots. This results in a certain number of collet fingers of the collet. The slots should be distributed radially along and evenly around the diameter of the sliding bush. The rigidity and clamping force of the collet can be set via the wall thickness of the hollow cylinder, the length of the collet fingers and/or the slot depth, as well as via the chosen modulus of elasticity E of the material. The small diameter of the stepped bore in the cylinder should, of course, be smaller than the piston operating rod diameter and already have an ideal diameter that matches the diameter of the piston operating rod.

Further advantages result from the description and the drawing. Moreover, the features stated above and further below can be used inventively individually or together in any combination. The embodiments shown and described are not intended to be an exhaustive list, rather are examples to explain the invention.

The invention is shown in the drawing and is explained in more detail using the example of the embodiments. The figures show:

BRIEF DESCRIPTION OF THE DRAWING

FIG. 1 an embodiment of the inventive NMR probe head in a schematic vertical section showing the motorized variable capacitor;

FIG. 2 a circuit diagram of an RF resonant circuit with an NMR probe head according to prior art;

FIG. 3a the dynamic response of the motorized variable capacitor according to FIG. 1 during the non-steep edge of a sawtooth voltage;

FIG. 3b like FIG. 3a, but during the steep edge of the sawtooth voltage;

DESCRIPTION OF THE PREFERRED EMBODIMENT

Figure 4:
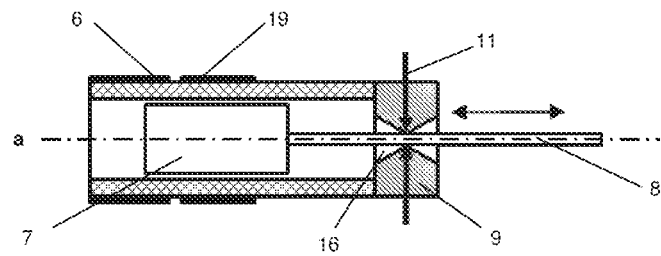
FIG. 4 a variant of the invention with two electrodes on the dielectric of the variable capacitor.

FIG. 1 illustrates an embodiment of the inventive NMR probe head as described in detail below.

FIG. 2 shows a simple circuit diagram of an RF resonant circuit of an NMR probe head according to the prior art with a transmission and reception coil 1 an inductance L, a coaxial cable 2 with an electrical impedance of 50 ohms, a continuously variable capacitor 3 with capacitance $C_T$ for tuning, as well as a continuously variable capacitor 4 with capacitance $C_M$ for matching. The variable capacitors 3 and 4 for tuning and matching at least one RF resonant circuit can be implemented as linearly adjustable capacitors.

A preferred configuration of such a linearly adjustable capacitor in an inventive NMR probe head with a dielectric 5 that at least partially surrounds cavity 15, as well as a piezo-electrical actuator 12 and a mass element 13 of mass m is illustrated in FIG. 1. A first and second electrical potential of the capacitor is picked off at an electrode 6 or at a capacitor piston 7, the electrically conductive lateral surface of the capacitor piston constituting the electrode. The capacitor piston 7 is contacted via an electrically conductive piston operating rod 8, which is electrically conductively connected to the capacitor piston 7. If the inventive sliding bush 9, 9' with through-hole 16 is also electrically conductive and electrically short-circuited with the capacitor piston 7 via the electrically conductive piston operating rod 8, the desired electrical potential can be picked off on the capacitor piston 7 without any problem at the sliding bush 9, 9'.

There are several further variants for implementing variable capacitors:

FIG. 4 shows an embodiment of an inventive NMR probe head with a variable capacitor with two electrodes 6, 19 on the dielectric 5. This variable capacitor is contacted at the two electrodes 6, 19. In the case of this variable capacitor, the piston operating rod 8 and the sliding bush 9 are preferably made of en electrically non-conductive material.

By means of the manual or motorized displacement, via the adjusting rods, cardan joints, flexible shafts, toothed gearing, and/or helical gearing, of the piston operating rod 8 or the capacitor piston 7 along the axis a of the piston operating rod 8, the capacitance of the variable capacitor can be set within a certain range.

The variable capacitor in FIG. 1 is mechanically fastened to the NMR probe head via the sliding bush 9. It is also frequently constituted such that the piston operating rod 8 is clamped via a suitably designed sliding bush 9 with a certain force $F_K$, and that, for that reason, a friction force $F_R$ has to be overcome to displace the capacitor piston 7. This has the advantage that the piston operating rod 8 or the capacitor piston 7 remains in position during the NMR experiment, even in case of temperature fluctuations or thermal expansions of the adjustment rod, and do not become maladjusted. The direction of action of the clamping force $F_K$ is indicated in the FIGS. 1, 3a, 3b, 4, and 5 by the opposite arrows 11.

It is now very advantageous that a suitable motor for displacing the capacitor piston 7 is mounted directly on the piston operating rod 8. Such a motorized variable capacitor considerably reduces the material costs and the manufacturing complexity of an NMR probe head. Suitable motors or actuators that can be placed in the stray field or directly in the magnetic center of an NMR magnet are piezo-electric motors. Piezo-electric actuators produce the driving force with such motors [5, 6]. Piezo-electric actuators have the property that they expand positively or expand negatively or shear if an electric voltage is applied in their polarization direction or in the opposite direction or orthogonally thereto respectively. A magnetic field does not influence this property of such a piezo-electric actuator.

A motorized variable capacitor can be implemented in the following way: If, on the piston operating rod 8 of the adjustable capacitor piston 7 guided in a sliding bush 9 with friction, a piezo-electric actuator 12 acting in the adjustment direction along the axis a and on the latter a mass element 13 with mass m opposite the piston operating rod 8, which is guided with friction in the sliding bush 9, is fastened, a motorized variable capacitor, adjustable in steps, results (see, for example, FIG. 1). By applying a sawtooth-waveform voltage to the piezo-electric actuator 12 in its polarization direction 14, the capacitor piston 7 executes one step Δl per sawtooth (see FIGS. 3a, 3b).

The method of operation of the motorized variable capacitor is described below, based on the assumption that
1. the piezo-electric actuator 12 has zero mass,
2. and the gradient of the steep sawtooth edge 18 is infinite, During the non-steep edge 17 of the sawtooth voltage, the actuator 12 with length l is expanded by Δl, displacing the mass m by Δl. The capacitor piston 7 with mass $m_K$ and the piston operating rod 8 with mass $m_{KS}$, however, remain in place because the friction 10 between the sliding bush 9 and the piston operating rod 8 is not overcome. At the instant of the steep edge 18 of the sawtooth voltage, the masses undergo infinite accelerations because the actuator 12 returns to its original length l at one instant. Because at this instant the friction between 9 and the piston operating rod 8 is also no longer relevant (friction negligible compared with the inertial forces), the piston operating rod 8 slides through the sliding bush 9 and the capacitor piston 7 executes one step Δs. By repetition of this process, any distances can be covered. By changing the electrical polarity of the sawtooth voltage, the direction of movement of the capacitor piston can be altered.

The step Δs is smaller than the deflection Δl of the piezo-electric actuator and depends on the masses of mass m 13, of the capacitor piston 7 $m_K$, and the piston operating rod 8 $m_{KS}$:

$$\Delta s = (m/(m+m_K+m_{KS}))\Delta l$$

In reality, however, the mass of the actuator 12 $m_A$ is not negligible and has an influence on the step size Δs:

$$\Delta s = ((m+1/2\ m_A)/(m+m_K+m_{KS}+m_A))\Delta l$$

If the masses $m_K$ and $m_{KS}$ are negligible as compared with the mass $m_A$ of the actuator 12, it is possible to dispense with the mass m 13 because in this way reasonably sized steps Δs (max. Δl/2) can still be executed.

In a nuclear magnetic resonance probe head, the direction of motion of a variable capacitor is usually vertical. In this installation orientation, the gravitational force of the moving part of the variable capacitor must not exceed the friction between the sliding bush 9 and the piston operating rod 8. Moreover, it must be noted that the second assumption above does not quite correspond to reality either. Because the gradient of the steep edge of the sawtooth voltage will never really be infinite, in reality not only the masses but also the friction between the sliding bush 9 and the piston operating rod 8, the elasticity of the entire variable capacitor, and loads in the direction of motion of the piston operating rod 8 influence the effective step size Δs. For that reason, unlike in the idealized case, the step size Δs will not be equal in both directions of motion if the variable capacitor is not operated horizontally.

The sliding bush 9 can be implemented integrally or in multiple parts in different embodiments of the invention.

Figure 6A:
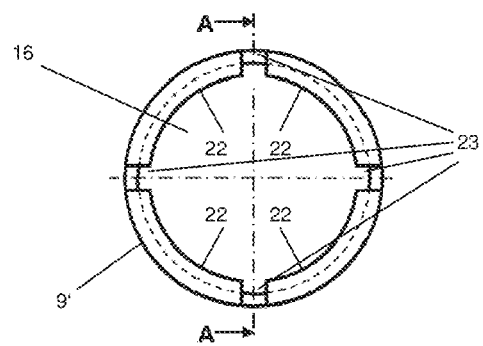
FIG. 6a an integral sliding bush with a through-hole of diameter d, which is constituted in the shape of a collet, in a schematic cross-section.
Figure 6B:
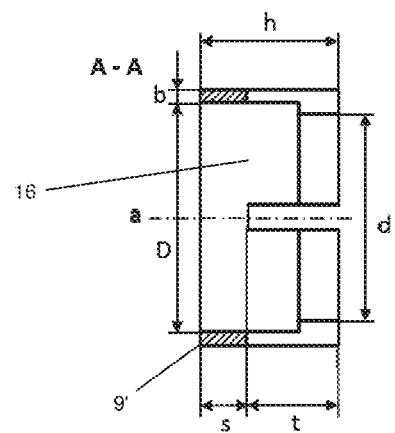
FIG. 6b like FIG. 6a, but in a schematic longitudinal section.

FIGS. 6a and 6b show by way of example a special integral sliding bush 9' with a stepped, collet-shaped through-hole 16. This integral sliding bush 9' with the overall height h has a ring-shaped and a mechanically rigid region with the inside diameter D and the cross-section b×s, on which, by a number of slots 23, an equal number of collet fingers are constituted. These collet fingers are radially distributed along and evenly around the diameter d of the integral sliding bush 9'. The diameter d is smaller than the diameter of the piston operating rod 8, to that the bearing surfaces 22 of the sliding bush 9' clamp the piston operating rod 8 and produce mechanical friction between the bearing surfaces 23 and the piston operating rod 8. The rigidity of the collet can be set via the wall thickness b, the length of the collet fingers and/or the slot depth t, as well as via the chosen modulus of elasticity E of the material.

The sliding bush 9, 9' can be made of electrically conductive or non-conductive (e.g. ceramic Si3N4) material. By means of the cross-sectional shape (e.g. rectangular) of the piston operating rod 8 and the through-hole 16, the moving part of the variable capacitor comprising the capacitor piston 7, the piston operating rod 8, the actuator 12 and the mass element 13, can be secured against rotation.

Figure 5:
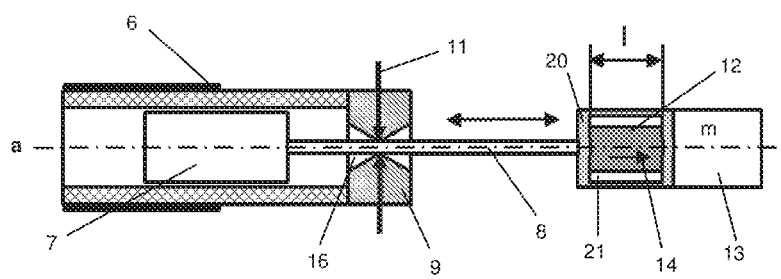
FIG. 5 like FIG. 1a, but with a piezo-electric actuator of the motorized variable capacitor mechanically clamped by a mass element.

A further embodiment of a motorized variable capacitor is shown in FIG. 5. In this case, the variable capacitor from FIG. 1 is augmented by a mechanical hollow body 20. The mechanical hollow body 20 is constituted such that it has a cavity 21, which can contain the piezo-electric actuator 12.

Through the cavity 21, which has in the polarization direction 14 a correspondingly smaller dimension than the length l of the piezo-electric actuator, the piezo-electric actuator 12 is clamped in such a way that during operation it is minimally subjected to tensile stress. This reduces the dangers of cracking in the piezo-electric actuator 12 and of incipient spot breakage of the piezo-electric actuator 12 and therefore increases its service life. This variant of a motorized variable capacitor can also be implemented by manufacturing the mechanical hollow body 20 and the mass element 13 combined and from one piece.

The piezo-electric actuator 12 can constituted as a monolithic block of piezo-electric material with length l and with two mounted electrodes with distance l or from n, usually disks of piezo-electric material bonded together with thickness l/n and each with two mounted electrodes with the distance l/n (piezo-electric stack actuators). In the case of such piezo-electric stack actuators, the individual disks are bonded together and the individual electrodes have to be electrically interconnected in a suitable manner. The stack actuators are more complex to manufacture, but have the advantage that, for an expansion Δl, they require much lower voltages $V_{pp}$ (typically $V_{pp}$=50 . . . 200V), than monolithic piezo-electric actuators.

Unlike known motorized variable capacitors [7, 8, 9], this invention has the advantage that using an already known and often successfully used structure of a variable capacitor together with just one piezo-electric actuator 12, and if necessary, a mass element 13 and a suitable sliding bush 9, 9', an extremely compact motorized variable capacitor can be implemented in a simple way, which can be installed in large numbers in an NMR probe head in the vicinity of the magnetic center of an NMR magnet. Moreover, this NMR probe head can be implemented in a vacuum and/or under cryogenic temperatures. All of the disadvantages and difficulties stated above can be eliminated with this inventively modified motorized variable capacitor.

LIST OF REFERENCE SYMBOLS (1) Transmission and reception coil L of an NMR probe head
(2) Coaxial cable 50 Ohm
(3) Continuously variable capacitor CT (tuning)
(4) Continuously variable capacitor CM (matching)
(5) Dielectric of the variable capacitor
(6) Electrode: electrically conductive layer (capacitor surface and electric contacting)
(7) Adjustable capacitor piston (electrically conductive): the outer surface of the capacitor piston is the (second) electrode of the variable capacitor
(8) Piston operating rod: coupling interface of the adjustable capacitor (7) or the adjustment rod (e.g. adjustment rods, cardan joint, and/or motor)
(9,9') Sliding bush (mechanical fastening & electrical contacting)
(11) Direction of action (opposite arrows) of the clamping force FK of the sliding bush
(12) Piezo-electric (or piezo-strictive) actuator of length l
(13) Mass element with mass m
(14) Polarization direction of the piezo-electric actuator
(15) Cavity at least partially surrounded by the dielectric (5)
(16) Through-hole of the sliding bush (9,9')
(17) Non-steep edge of the sawtooth voltage
(18) Steep edge of the sawtooth voltage
(19) Further electrode on the dielectric (5)
(20) Mechanic hollow body with the corresponding dimensions for receiving the piezo-electric actuator (12), which stresses or prestresses the latter in its polarization direction (14)
(21) Cavity of the mechanical hollow body (20)
(22) Storage surfaces for the piston operating rod (8)
(23) Slots of the integral sliding bush (9')
(a) Longitudinal axis of the piston operating rod (8)

LIST OF REFERENCES

[1] Agilent ProTune: http://www.chem.agilent.com/Library/datasheets/Public/5991-0043EN.pdf
[2] Jeol auto-tune: http://www.jeolusa.com/PRODUCTS/AnalyticalInstrunments/Nuclear MagneticResonance/Probes/tabid/381/Default.aspx
[3] Bruker A T M: http://www.bruker-biospin.com/cryoprobe_atm.html
[4] Agilent ProTune-PZT: http://www.chem.agilent.com/en-US/products-services/Instruments-Systems/Nuclear-Magnetic-Resonance/ProTune-PZT/Pages/default.aspx
[5] U.S. Pat. No. 5,568,004
[6] U.S. Pat. No. 4,894,579
[7] U.S. Pat. No. 3,213,340
[8] U.S. Pat. No. 3,447,047
[9] U.S. Pat. No. 7,061,745 B2
[10] US 2008/0 117 560 A1

I claim:

1. An NMR probe head having an RF resonant circuit, the probe head comprising:
    at least one capacitor that is part of the RF resonant circuit, said capacitor having a dielectric, which at least partially surrounds a cavity, said dielectric being connected to at least one electrode at which an electrical potential of said capacitor can be picked off, wherein a capacitor piston with an electrically conductive surface is disposed in said cavity within said dielectric;
    a piezo-electric actuator disposed outside said cavity as an extension of an axis of said capacitor piston;
    a piston operating rod mechanically connected to said piezo-electric actuator and cooperating with said capacitor piston to move said capacitor piston in said cavity; and
    a sliding bush mechanically connected to said dielectric, said sliding bush having a through-hole through which said piston operating rod extends, wherein said piston operating rod moves said capacitor piston linearly in response to application of a sawtooth-waveform electric voltage to said piezo-electric actuator to tune said capacitor, said sliding bush thereby applying braking friction to said piston operating rod during linear displacement of said capacitor piston in such a fashion that said piston operating rod only slides through said through-hole during steep edges of said applied sawtooth voltage.

2. The NMR probe head of claim 1, further comprising a mass element of mass m attached to a side of said piezo-electric actuator facing away from said piston operating rod, wherein, when said sawtooth-waveform electric voltage is applied to said piezo-electric actuator, said mass element moves with said actuator in a polarization direction thereof, said mass m thereby producing additional inertial forces.

3. The NMR probe head of claim 2, further comprising a hollow mechanical body having a cavity in which said piezo-electric actuator is received, wherein said hollow mechanical body mechanically stresses said piezo-electric actuator in a polarization direction thereof.

4. The NMR probe head of claim 3, wherein a mechanical stress exerted by said hollow mechanical body on said piezo-electric actuator is chosen to be sufficiently large that said piezo-electric actuator is always compressed during operation.

5. The NMR probe head of claim 3, wherein said hollow mechanical body is integral with said mass element.

6. The NMR probe head of claim 2, wherein at least one of moving parts of said capacitor, said capacitor piston, said piston operating rod, said piezo-electric actuator and said mass element, can be secured against rotation about said axis of said capacitor piston by a choice of cross-sectional shape or of a triangular cross-section, at least of said piston operating rod and of said through-hole of said sliding bush.

7. The NMR probe head of claim 1, wherein at least outer surfaces of said capacitor piston and said piston operating rod are constructed from electrically conductive material on which an electrical connection of said capacitor is mounted, wherein a second electrical potential of the capacitor can be picked off at said electrical connection.

8. The NMR probe head of claim 7, wherein at least outer surfaces of said sliding bush are also constructed from electrically conductive material and form an electrical contact with said piston operating rod so that said second electrical potential of said capacitor can be picked off at said sliding bush.

9. The NMR probe head of claim 1, wherein said capacitor is mechanically rigidly fastened to the NMR probe head via said sliding bush.

10. The NMR probe head of claim 1, wherein said sliding bush has a mechanically rigid part and an elastic part.

11. The NMR probe head of claim 10, wherein said elastic part of said sliding bush is constituted in a shape of a collet, said collet clamping said piston operating rod to produce mechanical friction.

12. The NMR probe head of claim 11, wherein said collet provides an electrically conductive contact between said sliding bush and said piston operating rod.

13. The NMR probe head of claim 10, wherein said mechanically rigid part is integral with said elastic part of said sliding bush.

* * * * *